US010679842B2

(12) United States Patent
Yoshida et al.

(10) Patent No.: US 10,679,842 B2
(45) Date of Patent: Jun. 9, 2020

(54) SEMICONDUCTOR WAFER, AND METHOD FOR POLISHING SEMICONDUCTOR WAFER

(71) Applicant: JX Nippon Mining & Metals Corporation, Tokyo (JP)

(72) Inventors: Taku Yoshida, Ibaraki (JP); Hideki Kurita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 16/327,067

(22) PCT Filed: Apr. 6, 2018

(86) PCT No.: PCT/JP2018/014679
§ 371 (c)(1),
(2) Date: Feb. 21, 2019

(87) PCT Pub. No.: WO2018/198718
PCT Pub. Date: Nov. 1, 2018

(65) Prior Publication Data
US 2019/0189421 A1 Jun. 20, 2019

(30) Foreign Application Priority Data
Apr. 28, 2017 (JP) .................................. 2017-089581

(51) Int. Cl.
*H01L 21/02* (2006.01)
*B24B 57/02* (2006.01)
(Continued)

(52) U.S. Cl.
CPC ........ *H01L 21/02013* (2013.01); *B24B 37/08* (2013.01); *B24B 37/20* (2013.01);
(Continued)

(58) Field of Classification Search
CPC ......... H01L 21/02013; H01L 21/02016; H01L 21/02024; H01L 21/304; B24B 37/08; B24B 37/20; B24B 57/02; C30B 29/40
See application file for complete search history.

(56) References Cited

U.S. PATENT DOCUMENTS 10,319,807 B2 * 6/2019 Shoji ................. H01L 21/02021
2006/0169988 A1 8/2006 Itani
(Continued)

FOREIGN PATENT DOCUMENTS

JP 07235519 A 9/1995
JP 11207607 A 8/1999
(Continued)

OTHER PUBLICATIONS

Kimura et al., "A New Method for the Precise Measurement of Wafer Roll off of Silicon Polished Wafer", Japanese Journal of Applied Physics, Jan. 1999, vol. 38, pp. 38-39.
(Continued)

*Primary Examiner* — Peter Bradford
(74) *Attorney, Agent, or Firm* — Faegre Drinker Biddle & Reath LLP

(57) ABSTRACT

The present invention provides: an InP wafer optimized from the viewpoint of small edge roll-off (ERO) and sufficiently high flatness even in the vicinity of a wafer edge; and a method for effectively producing the InP wafer. The InP wafer having a roll-off value (ROA) of from $-1.0$ μm to $1.0$ μm is obtained by using a method including: performing a first stage polishing under a processing pressure of from 10 to 200 g/cm$^2$ for a processing time of from 0.1 to 5 minutes, while supplying a polishing solution containing bromine to at least one side of an InP single crystal substrate that will form the InP wafer; and performing a second stage polishing under a processing pressure of from 200 to 500 g/cm$^2$ for a processing time of from 0.5 to 10 minutes, provided that the
(Continued)

processing pressure is higher than that of the first stage polishing by 50 g/cm² or higher.

11 Claims, 1 Drawing Sheet

(51) Int. Cl.
  *C30B 29/40* (2006.01)
  *B24B 37/20* (2012.01)
  *B24B 37/08* (2012.01)
  *H01L 21/304* (2006.01)
(52) U.S. Cl.
  CPC .............. *B24B 57/02* (2013.01); *C30B 29/40* (2013.01); *H01L 21/02016* (2013.01); *H01L 21/02024* (2013.01); *H01L 21/304* (2013.01)

(56) References Cited

U.S. PATENT DOCUMENTS

| | | | | |
|---|---|---|---|---|
| 2008/0115422 | A1* | 5/2008 | Suzuki | C08F 220/26 51/298 |
| 2008/0176400 | A1* | 7/2008 | Hachigo | C30B 29/40 438/691 |
| 2009/0029552 | A1* | 1/2009 | Schwandner | B24B 7/228 438/693 |
| 2011/0221040 | A1* | 9/2011 | Joshi | H01L 21/02002 257/618 |
| 2014/0141613 | A1 | 5/2014 | Heilmaier et al. | |
| 2017/0110332 | A1* | 4/2017 | Beveridge | H01L 21/30625 |
| 2017/0363406 | A1 | 12/2017 | Fujiwara et al. | |
| 2018/0340095 | A1* | 11/2018 | Ward | C09G 1/04 |

FOREIGN PATENT DOCUMENTS

| | | |
|---|---|---|
| JP | 2001338899 A | 12/2001 |
| JP | 2003100575 A | 4/2003 |
| JP | 2004207417 A | 7/2004 |
| JP | 2006216788 A | 8/2006 |
| JP | 2012129416 A | 7/2012 |
| JP | 2014068044 A | 4/2014 |
| JP | 2014103398 A | 6/2014 |
| WO | 2012169515 A1 | 12/2012 |
| WO | 2016129172 A1 | 8/2016 |

OTHER PUBLICATIONS

Iwasaki et al., "6-in Diameter InP Single Crystals Grown by the Hot-Wall LEC Method and the Mirror Wafers", IEEE Transactions on Semiconductor Manufacturers, vol. 16, No. 3, Aug. 2003, pp. 360-364.

International Preliminary Report on Patentability for PCT/JP2018/014679, from WIPO dated Nov. 7, 2019, 7 pages.

* cited by examiner

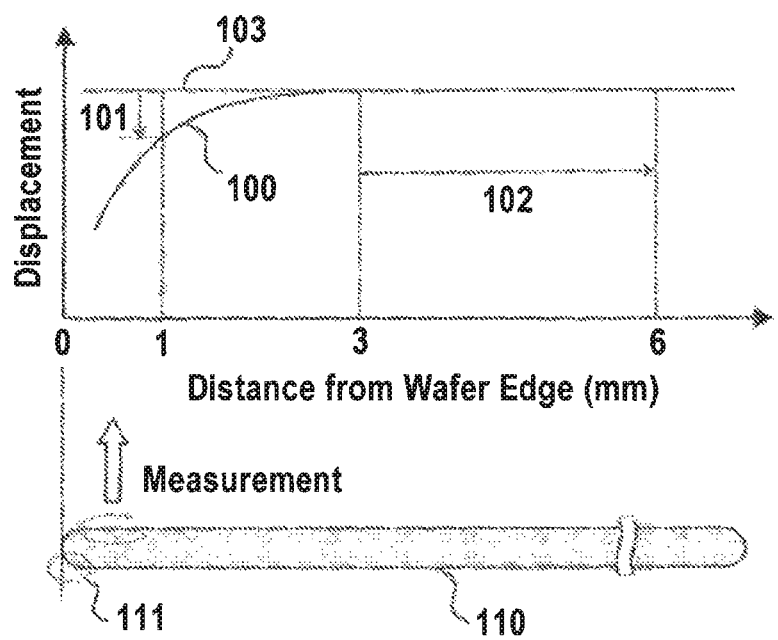

SEMICONDUCTOR WAFER, AND METHOD FOR POLISHING SEMICONDUCTOR WAFER

TECHNICAL FIELD

The present invention relates to a semiconductor wafer with improved flatness of an outer edge of the wafer, and to a method for polishing the semiconductor wafer. More particularly, the present invention relates to a large diameter indium phosphide (InP) single crystal wafer with improved flatness of an outer edge of the wafer, and to a method for polishing the semiconductor wafer.

BACKGROUND ART

Indium phosphide (InP) also called indium phosphorus is a group III-V compound semiconductor material composed of indium (In) of group III (group 13) and phosphorus (P) of group V (group 15). As the semiconductor material, the InP has characteristics of a band gap of 1.35 eV, and an electron mobility up to 500 $cm^2N \cdot s$, which is a higher electron mobility than other general semiconductor materials such as silicon and gallium arsenide. Further, the InP is characterized in that a stable crystal structure under normal temperature and pressure is a cubic zinc blende structure, and its lattice constant is larger than that of a compound semiconductor such as gallium arsenide (GaAs) and gallium phosphide (GaP).

Single crystal InP has a higher electron mobility than silicon (Si) and the like, and it is, therefore, used as a material for high-speed electronic devices utilizing it. Further, the single crystal InP has a larger lattice constant than that of gallium arsenide (GaAs) or gallium phosphide (GaP) and can decrease a lattice mismatch rate when used as a substrate for heteroepitaxial growth of a ternary mixed crystal such as InGaAs and quaternary mixed crystal such as InGaAsP. Therefore, the single crystal InP is used for various optical communication devices such as semiconductor lasers, optical modulators, optical amplifiers, optical waveguides, light emitting diodes, and light receiving elements, which form those mixed crystal compounds as a laminated structure, and is used as a substrate for compound optical integrated circuits thereof.

The substrate for forming the various devices as described above are produced through the following steps, for example. First, a single crystal InP ingot is cut into thin plates (wafers) in a predetermined crystal orientation (a slicing step). Both surfaces of each wafer are then ground and coarsely polished or rubbed against flat surfaces such as iron or glass plates with an abrasive (a lapping step) to reduce a variation of wafer thickness. The surfaces of the wafer surface is then mirror-polished (a polishing step) to obtain a wafer with high flatness. The wafer is then washed (a rinse step), and inspected for the presence or absence of defects or dusts on the wafer (an inspection step). To obtain a wafer with high flatness, the mirror-polishing (polishing) step is particularly important.

Recently, the flatness of the wafer is focused on various surface roughness such as Ra (arithmetic mean roughness), Rz (maximum height roughness) and Rq (root mean square roughness) which are generally used in the prior art, and evaluation indices such as a whole or local thickness variation of the wafer (TTV; Total Thickness Variation, LTV; Local Thickness Variation), as well as edge roll off (ERO; Edge-Roll-Off) indicating a so-called "surface sagging" near an edge of the wafer surface. In general, a semiconductor wafer or the like whose surface has been mirror-polished has a surface shape in which flatness is deteriorated near an edge of the wafer, resulting in "surface sagging", because of the characteristics of the polishing step.

With the miniaturization of semiconductor devices, a demand for resolution of an exposure apparatus used for forming the device has become severer. To achieve higher resolution, it is necessary to shorten a wavelength of an exposure light source, but a depth of focus of an optical system of the exposure apparatus becomes shallower accordingly. Therefore, in the recent device processing technique which has been miniaturized, the surface of the wafer forming the device has also been required to be sufficiently flat because the depth of focus of the optical system of the exposure apparatus has been shallower. However, the use of the wafer with larger ERO as described above results in poor performance of the device produced near the edge of the wafer, leading to a deterioration of a final production yield and an increase in product cost.

Therefore, in order to maximize an effective device-forming region on the wafer and suppress variations in the performance between devices to be formed, it is important to obtain a wafer with reduced ERO. It is believed that the generation of ERO is caused by a difference in a process parameter related to polishing between a central portion and an edge portion of the wafer, such as a difference in a relative moving speed of the wafer to a polishing pad between the vicinity of the central portion of the wafer and the vicinity of the edge portion of wafer during the mirror-polishing process of the wafer. Therefore, to reduce ERO, it is necessary to consider a polishing method closely related to the reduction of ERO.

For the method for polishing the wafer, the following prior arts are known. Patent Document 1 describes a method for polishing a gallium nitride (GaN) wafer, in which the wafer is polished with a soft material having a Vickers hardness Hv in a range of $50 \leq Hv \leq 2800$. Patent Document 2 discloses that polishing is performed by dividing a polishing process into two stages and setting different polishing conditions at each stage. Although not related to the polishing method, each of Patent Document 3 and Non-Patent Document 1 discloses that a wafer is evaluated by an evaluation value of a Roll-off amount (ROA) which quantifies a degree of ERO, as a parameter indicating flatness near the edge portion of the wafer. Patent Document 3 also describes an example in which an ROA value of about 10 nm is achieved in a silicon wafer.

However, Patent Document 1 is an art relating to GaN wafers, and Patent Documents 2 and 3 relate to Si wafers, which are not related to the InP wafer targeted by the present invention. Both GaN and Si single crystals are rigid materials each having a Young's modulus of from about 180 to 200 GPa, whereas the InP has a Young's modulus of about 60 GPa and is a soft and brittle material as a semiconductor material. Also, their chemical properties are quite different for each substance. Therefore, for the process of polishing in which an action of physical force and a type and process of chemical reaction greatly affect the result, the technical findings for other materials such as GaN and Si cannot be simply applied to the InP.

In general, the polishing of the InP wafer is carried out by placing the wafer on a rotating surface plate having a polishing pad on its surface and rotating the surface plate and the wafer while supplying a polishing solution having a predetermined composition, thereby gradually removing the elements on the surface of the wafer by, a mechanical or chemical action. As the composition of the polishing solution, a composition containing a combination of abrasive fine particles having a mechanical grinding action of the surface of the wafer such as colloidal silica and a chlorine compound having a chemical etching action, as described in Patent Document 4 or Patent Document 5, is conventionally known. Also, a method for flattening the surface of the InP wafer by a chemical etching action is conventionally known as described in Patent Document 6 or the like.

In these prior arts relating to polishing of the InP wafer, means and conditions for polishing are optimized from the viewpoints of TTV or undulation of the wafer, residual impurities and scratches, a polishing rate, a polishing efficiency and the like. However, in these prior arts there is no recognition of ERO which has been emphasized with recent miniaturization and there is no specific means effective for reducing ERO nor any technical teaching.

Non-patent document 2 mentions "roll-off" (which has the same meaning as ERO) for the InP single crystal wafer, and discloses that any optimum polishing composition is not well known for the InP and that prolonged polishing with a soft polishing cloth tends to increase the roll-off. However, even in this prior art there is only a slight vague teaching as described above, and any specific polishing composition and polishing conditions effective for reducing ERO are not clear. Furthermore, this prior art does not disclose any specific value of the roll-off value achieved.

CITATION LIST

Patent Literatures

Patent Document 1: Japanese Patent Application Publication No. 2014-068044 A
Patent Document 2: Japanese Patent Application Publication No. 2014-103398 A
Patent Document 3: Japanese Patent Application Publication No. 2012-129416 A
Patent Document 4: Japanese Patent Application Publication No. H11-207607 A
Patent Document 1: Japanese Patent Application Publication No. 2004-207417 A
Patent Document 1: Japanese Patent Application Publication No. H07-235519 A Non-Patent Literatures Non-Patent Document 1: M. Kimura et al., Jpn. J. Appl. Phys., Vol. 38 (1999), pp. 38-39
Non-Patent Document 2: K. Iwasaki et al., IEEE Trans. Semicond. Manuf., Vol. 16 (2003), pp. 360-364

SUMMARY OF INVENTION

Technical Problem

Thus, the demand for reducing ERO of the InP wafer has been increased in recent years. However, in a current condition, any sufficient study is not made from the viewpoint of reducing ERO, and from such a viewpoint, any InP wafer having optimized characteristics relating to ERO cannot be obtained. Accordingly, an object of the present invention is to provide an InP wafer optimized from the viewpoint that the ERO is small and the flatness is sufficiently high even near the wafer edge. Also, an object of the present invention is to provide an effective method for producing such an InP wafer. In the present invention, a degree of ERO is expressed by using an evaluation value called a roll-off value (ROA value) as an index that quantifies a degree of edge roll off (ERO) which means a phenomenon called "surface sagging".

Solution to Problem

As a result of intensive studies from the viewpoint of reducing the ROA value for the InP wafer, the present inventors have found that it has been effective to modify processes conventionally performed in the mirror-polishing so as to apply two-stage polishing under specific conditions. As a result of further investigation on the technical findings, the present inventors have found that an InP substrate having a ROA value sufficiently lower than the level conventionally achieved could be obtained, and have completed the present invention.

Based on such findings, the present invention provides the following inventions:

1) An indium phosphide (InP) wafer, the wafer comprising an InP single crystal, wherein the wafer has a roll-off value (ROA) of from −1.0 µm to 1.0 µm.

2) The InP wafer according to the aspect 1), wherein a central portion of the wafer has an arithmetic mean roughness (Ra) of 0.5 nm or less.

3) The InP wafer according to the aspect 1) or 2), wherein the wafer has a total thickness variation (TTV) of 10 µm or less.

4) The InP wafer according to any one of the aspects 1) to 3), wherein the wafer has a thickness of 300 µm or more and 1000 µm or less.

5) The InP wafer according to any one of the aspects 1) to 4), wherein a surface of the wafer has a maximum length of 45 mm or, more.

6) The InP wafer according to any one of the aspects 1) to 5), wherein a surface of the wafer has a maximum length of 50 mm or more.

7) The InP wafer according to any one of the aspects 1) to 6), wherein a surface of the wafer has a maximum length of 75 mm or more.

8) The InP wafer according to any one of the aspects 1) to 7), wherein a surface of the wafer has a maximum length of 100 mm or more.

9) A method for producing an InP wafer, the wafer comprising an indium phosphide (InP) single crystal, the method comprising: performing a first stage polishing under a processing pressure of from 10 to 200 $g/cm^2$ for a processing time of from 0.1 to 5 minutes, while supplying a polishing solution containing bromine to at least one side of an InP single crystal substrate that will form the InP wafer; and performing a second stage polishing under a processing pressure of from 200 to 500 $g/cm^2$ for a processing time of from 0.5 to 10 minutes, provided that the processing pressure is higher than that of the first stage polishing by 50 $g/cm^2$ or higher.

10) The method for producing the InP wafer according to the aspect 9), wherein the polishing is performed by using a rotating surface plate having a polishing pad made of soft foamed polyurethane attached to a surface of the rotating surface plate.

11) The method for producing the InP wafer according to the aspect 9) or 10), wherein the polishing is performed at a supply flow rate of the polishing solution of from 10 to 500 ml/min and at a rotation speed of the surface plate of from 10 to 100 rpm.

Advantageous Effects of Invention

According to the InP wafer of the present invention, the ROA value is reduced as compared with the prior arts and the flatness is sufficient even near the wafer edge, so that the maximum forming region of a device can be ensured to the vicinity of the edge of the wafer, and an exposure process error between the devices formed in the wafer can be suppressed to a lower level, thereby improving the uniformity of performance between the devices formed on the same wafer. Furthermore, according to the method for producing the InP wafer of the present invention, it is possible to produce effectively and efficiently an InP wafer in which the above ROA value is reduced.

BRIEF DESCRIPTION OF DRAWINGS

FIG. 1 shows a method for calculating an ROA value.

DESCRIPTION OF THE PREFERRED EMBODIMENTS

An InP wafer according to the present invention refers to an InP single crystal in the form of a thin plate having a sufficiently small thickness (t) which is the maximum distance between front and back surfaces, relative to the maximum length (L) on the front or back surface of the thin plate, which means L/t≥10. The shape of the front or back surface of the wafer is not particularly limited, but it may be a circular shape that is widely used as a wafer, and it may be a polygonal shape such as an elliptical shape and a quadrangular shape, depending on the use form.

The InP wafer according to the present invention is essentially characterized in that the wafer has an ROA value of from −1.0 μm to 1.0 μm. The ROA value of the wafer refers to a quantified evaluation value (or index value) of a degree of deterioration of flatness due to a change in a profile of the surface from a side close to a central portion toward an edge side of the wafer, in the vicinity of any edge of the front surface (or back surface) of the wafer. If the ROA value is smaller, the flatness equivalent to that on the side close to the center portion of the wafer where the surface profile of the wafer is hardly changed will be maintained even at the edge portion, which leads to improvement of a wafer utilization efficiency and suppression of variations in performance of devices produced in the same wafer.

The ROA value of the InP wafer according to the present invention can be quantified by the following analysis procedure as disclosed in Non-Patent Document 1, for example. First, for at least one mirror-polished surface of the wafer, a surface displacement profile near the edge portion on the surface is measured. The measurement of the surface displacement profile is performed at a distance of at least 1 mm to 6 mm from the edge portion required for the calculation of the ROA, by any measuring means that can follow displacement corresponding to the roll-off amount of the distance with a sufficient resolution (which is 10 nm in the case of the measuring instrument used in the present invention), which can be a laser surface type or stylus type surface shape measuring device or the like.

FIG. 1 shows a schematic view of a measurement example of a profile displacement curve 100 near the edge portion of the surface of an InP wafer 110. For calculating a ROA value 101 of the wafer, a surface displacement profile measured in a distance of 1 mm to 6 mm from the edge portion of the wafer to the central portion side is required. A semiconductor wafer such as InP is conventionally subjected to processing (beveling) for providing a chamfered portion 111 in a distance of 1 mm from the edge portion after cutting, in order to prevent occurrence of cracks or chips at the edge portion of the wafer during lapping and polishing steps. Therefore, in view of effects of the processing, any profile up to 1 mm from the edge portion is not used for the evaluation of ROA.

In the surface displacement profile, there is no significant change in profile displacement in a distance of 3 to 6 mm from the edge portion of the wafer to the central portion side, as compared with the vicinity of the central portion of the wafer. Therefore, the region in this distance is defined as a reference region 102, and the surface profile is used as a reference plane for reference (reference profile). Specifically, a profile function 103 is obtained from a straight line connecting measurement points at a position of 3 mm and a position of 6 mm from the wafer edge to the central portion side, and this is used as the reference profile for reference.

The ROA value of the wafer is defined as a difference between a value extrapolated in a distance of 1 mm from the edge portion of the wafer in the reference profile function obtained from the surface profile of the reference region 102 and an actual value of the surface profile. The example of FIG. 1 shows a wafer that generates at the edge portion a so-called "surface sagging" in which a measured value is lower than the extrapolation value of the profile function, and in this case, the ROA value will be a positive value. However, depending on the polishing conditions and the like, a wafer showing a surface profile raised near the edge portion than the reference region are also seen, and in this case the ROA value will be a negative value.

In the InP wafer according to the present invention, the above ROA value falls within a range of from −1.0 μm to 1.0 μm. In an embodiment, the ROA value can be −0.8 μm or more, or −0.6 μm or more, or −0.4 μm or more. Similarly, in an embodiment, the ROA value may be 0.8 μm or less, or 0.6 μm or less, or 0.4 μm or less.

In one embodiment, the InP wafer according to the present invention has an arithmetic mean roughness (Ra) of 0.5 nm or less at the center of the wafer while the ROA value is in the range of from −1.0 μm to 1.0 μm as described above. In a general semiconductor wafer, the element-forming surface is finally mirror-finished by a polishing process. However, in the common polishing process, by doing this, a mirror surface with a small surface roughness is achieved at the center portion of the wafer, whereas surface sagging or the like is generated near the edge portion of the wafer, so that the flatness of the surface profile is deteriorated. In the conventional technique, as the polishing for a long period of time is carried out in order to reduce the surface roughness of the wafer, the flatness of the surface profile near the edge portion of the wafer is deteriorated and the ROA value tends to increase, accordingly.

That is, according to the conventional technique, there is a trade-off between obtaining of a mirror-finished wafer having a small surface roughness and obtaining of a wafer having a small ROA and maintaining the flatness of the reference profile up to the edge portion, and it is difficult to achieve both of them. The InP wafer according to the present invention achieves the characteristics of both of them, which has been conventionally difficult. The arithmetic mean roughness (Ra) in the present invention can be obtained by performing measurement in a range of 2 μm×2 μm with an atomic force microscope (AFM) and processing the measured data in accordance with JIS B 0633: 2001. The Ra value at the central portion of the wafer is 0.5 nm or less, and in one embodiment it may be 0.4 nm or less, further 0.2 nm or less.

Further, in one embodiment, the total thickness variation (TTV) of the InP wafer according to the present invention can be 10 μm or less. The TTV of the wafer is a value that is an index of the uniformity of the thickness of the entire wafer, and means that as the TTV is lower, the wafer thickness is more uniform. The TTV of the wafer is obtained from the maximum value and the minimum value of the surface displacement measured by irradiating the entire surface of the wafer with laser. In one embodiment, the TTV of the wafer can be 8 μm or less, more preferably 6 μm or less.

Although the thickness of the InP wafer according to the present invention is not particularly limited, it may be 300 μm or more and 1000 μm or less in one embodiment. If the thickness of the wafer is less than 300 μm, mechanical strength of the wafer may not be ensured, and excessive care is required for handling and the like. The thickness of the wafer may be further 400 μm or more, and it may be 500 μm or more. On the other hand, if the thickness of the wafer is more than 1000 μm, unnecessary portions are increased with respect to the thickness required for forming the device, so that the material utilization efficiency is decreased. Additionally, in this case, there are disadvantages in terms of an ease of cutting of the device and the weight. The thickness of the wafer may be further 800 μm or less, or 700 μm or less.

The maximum length of the surface of the InP wafer according to the present invention is also not particularly limited, but it may be 45 mm or more, 50 mm or more, 75 mm or more, or even 100 mm or more in one embodiment. The maximum length of the wafer surface is a length corresponding to a diameter in the case of a disc-like wafer. The present invention is an effective technique for a large-area InP wafer, and can be particularly effectively applied to a wafer having a maximum length (diameter) of about 100 mm (4 inches).

The above InP wafer according to the present invention is not particularly limited in its producing method and may be produced by any method as long as it satisfies each characteristic such as ROA. However, in terms of effectively achieving various characteristics such as the above ROA value, the producing method including a polishing means described below, which is another aspect of the present invention, can be suitably applied.

First, a substrate including an InP single crystal as a base of the InP wafer is prepared. The InP single crystal substrate may be prepared by producing an ingot made of an InP single crystal, cutting the ingot into a substrate having a predetermined thickness, and then grinding or lapping the ingot, or prepared by purchasing a commercially available substrate-like InP single crystal, or the like. When producing the substrate from the single crystal ingot, the producing method is not particularly limited, and the substrate can be produced by any known method, for example, various methods of crystal growth from melt, such as a vertical temperature gradient (VGF) method, a vertical bridgman (VB) method, a horizontal bridgman (HB) method, and a liquid sealed Czochralski (LEC) method.

When producing the InP wafer according to the present invention from the ingot-like InP single crystal, an operation of cutting out the single crystal ingot into a substrate is performed. The operation of cutting out the InP single crystal having a predetermined thickness can be performed using a known means such as a wire saw. The cutting thickness at this time is set so that a desired InP wafer can be obtained in view of a thickness fraction which will be reduced by subsequent lapping or polishing. The cut InP single crystal is subjected to chamfering (beveling) in a region within 1 mm from the edge portion, and the front and back surfaces of the substrate after beveling is further subjected to lapping in order to adjust roughly the wafer thickness and flatten the surface to some extent. The surface roughness of the lapped InP single crystal substrate can be Ra=10 μm or less.

After the lapping treatment, an etching treatment for removing any work-affected layer on the wafer surface and improving roughness or a polishing treatment with a hard pad may be optionally carried out. The means and conditions at that time are not particularly limited, and generally applicable means and conditions can be optionally adjusted and then applied. Before applying the polishing step of the present invention, the InP substrate may have ROA of from −0.5 to 0.5 μm and Ra of 1.0 nm or less. This is because if the ROA of the InP substrate before the polishing step of the present invention exceeds the range of from −0.5 to 0.5 μm, it is difficult to obtain an InP wafer with a small ROA even if the polishing of the present invention is applied, and if the Ra of the InP substrate is more than 1.0 nm, an excessive polishing load is required for finally obtaining the mirror-polished surface, so that even if the polishing of the present invention is applied, any sufficient flatness of the mirror surface may not be ensured.

The step of mirror-polishing the InP single crystal substrate to form an InP wafer greatly affects the final ROA value of the InP wafer. In the method for producing the InP wafer according to the present invention, the polishing step is essentially characterized by a combination of performing a first stage polishing under a processing pressure of from 10 to 200 $g/cm^2$ for a processing time of from 0.1 to 5 minutes, while supplying a polishing solution containing bromine to at least one side of the InP single crystal substrate; and performing a second stage polishing under a processing pressure of from 200 to 500 $g/cm^2$ for a processing time of from 0.5 to 10 minutes, provided that the processing pressure is higher than that of the first stage polishing by 50 $g/cm^2$ or higher.

In the method for producing the InP wafer according to the present invention, the polishing is performed while continuously supplying a bromine-based polishing solution to the polishing surface. The bromine that is a component in the polishing solution acts to remove the surface of InP at the atomic level by chemical etching, and the bromine concentration can be from 0.1 to 5 wt %.

In the method for producing the InP wafer according to the present invention, two-stage polishing steps having different conditions are applied stepwise. The first stage polishing is performed under conditions of a processing pressure of from 10 to 200 $g/cm^2$ and a processing time of from 0.1 to 5 minutes. If the processing pressure is less than 10 $g/cm^2$, the required flatness for the surface of the mirror-polished InP wafer may not be obtained. If the processing pressure at this stage is more than 200 $g/cm^2$, the final ROA value of the InP wafer may be deteriorated. In order to ensure the flatness of the InP wafer, a processing time at the first stage of at least 0.1 minutes or more is required. However, if it is more than 5 minutes, the ROA value of the InP wafer is adversely affected, which is not preferable. The processing pressure at the first stage polishing may be 70 $g/cm^2$ or more, and it may be further 120 $g/cm^2$ or less. The processing time may be 0.3 minutes or more, and furthermore 2 minutes or less.

The second stage polishing is then carried out under conditions of a processing pressure of from 200 to 500 $g/cm^2$ and a processing time of from 0.5 to 10 minutes. If the processing pressure is less than 200 $g/cm^2$, the required flatness for the surface of the mirror-polished InP wafer may not be obtained and the surface roughness may be deteriorated. If the processing pressure is more than 500 g/cm$^2$, the ROA value of the InP wafer may be deteriorated, as well as the flatness may be deteriorated depending on conditions, or the wafer may be damaged. The processing time at the second stage needs to be at least 0.5 minutes or more. However, if it is more than 10 minutes, the ROA value of the InP wafer is adversely affected, which is not preferable. The processing pressure in the second stage polishing may be 250 g/cm$^2$ or more, further 350 g/cm$^2$ or less. The processing time may be 1 minute or more, and furthermore 5 minutes or less.

The processing pressure in the first stage polishing of the above polishing steps is in the range generally applied in the prior art. Conventionally, continuous polishing for a long time is performed with that processing pressure, such that the required flatness for the mirror-polished surface is ensured. However, in such conventional polishing, sufficient flatness (mirror surface) of the polished surface can be achieved, but in terms of the ROA value, characteristics recently required can not necessarily be achieved. Thus, in the present invention, the first stage polishing under the conventional processing pressure is performed in a short period of time, and the second stage polishing under a greatly higher processing pressure than that of the prior art is performed in a short period of time, so that even if the total polishing load (processing pressure×polishing time) is the same, an InP wafer with an improved ROA value can be effectively obtained as compared with the prior art.

In carrying out the two-step polishing, the polishing should be performed by setting a higher processing pressure in the second stage polishing such that a difference in processing pressure between the second stage polishing and the first stage polishing is 50 g/cm$^2$ or higher. If the difference in processing pressure between the second stage polishing and the first stage polishing is less than 50 g/cm$^2$, the processing pressure in the first stage polishing is too close to that in the second stage polishing, so that deterioration of the ROA value of the InP wafer may not be sufficiently suppressed. The difference in processing pressure can be set to 80 g/cm$^2$ or more, or 100 g/cm$^2$ or more, depending on the embodiment of the polishing.

The polishing of the present invention can be carried out by using any means and apparatus as long as the polishing can be carried out while stably keeping the above processing conditions. Efficient polishing can be carried out by using a rotating surface plate apparatus in which a polishing pad is attached to a surface that will be in contact with the polishing surface of the InP single crystal substrate. The polishing pad used herein may be made of soft foamed polyurethane, which is effective to achieve the characteristic of the ROA value of the InP wafer according to the present invention.

Further, in the method for producing the InP wafer according to the present invention, the polishing can be performed by adjusting a supply flow rate of the polishing solution continuously supplied to the polishing surface and a rotation speed of the rotating surface plate to be used, such that desired polished surface characteristics, particularly the ROA value characteristics, can be obtained. As a guide, the supply flow rate of the polishing solution can be from 10 to 500 ml/min and the rotation speed of the surface plate can be from 10 to 100 rpm. In order to obtain the desired polished surface characteristics, the supply flow rate of the polishing solution may be 50 ml/min or more, or 80 ml/min or more, and 300 ml/min or less, or 200 ml/min. The rotation speed of the surface plate may be 30 rpm or more, or 50 rpm or more, and 90 rpm or less, or 80 rpm or less.

The InP wafer after completion of the above polishing step is subjected to washing, and an inspection step for evaluating the ROA value, surface defects, flatness and other characteristics to produce a product. Of course, it may further include any additional step to such an extent that the surface characteristics such as ROA are not affected, such as fine adjustment of the shape and marking, as needed.

EXAMPLES

Hereinafter, the present invention will be specifically described with reference to Examples and Comparative Examples. The descriptions of the following examples and comparative examples are merely specific examples for facilitating understanding of the technical contents of the present invention, and the technical scope of the present invention is not limited by these specific examples.

Example 1

A final one side polishing of an InP wafer having a diameter of 4 inches (101.6 mm), a thickness of 650 μm, an ROA of 0.29 μm, and an Ra of 0.55 nm was carried out by two-stage polishing steps as described below. The polishing was performed using a rotating surface plate having a diameter of 813 mmφ at a rotation rate of the surface plate of 60 rpm, with soft foamed polyurethane (Politex available from Nitta Haas Incorporated) as a polishing pad, and using a bromine-based polishing solution (2.5 wt. % of bromine), while continuously feeding the solution to the polishing surface at a flow rate of 100 ml/min. The total polishing load in the first and second stage polishing steps is 650 g/cm$^2$·min.

first stage polishing: a processing pressure of 100 g/cm$^2$, a polishing time of 30 sec (0.5 min); and second stage polishing: a processing pressure of 300 g/cm$^2$, a polishing time of 2.0 min.

After the end of the above polishing, washing and drying were carried out, and a thickness at the central portion of the wafer was measured. As a result, the thickness was 648 μm. The wafer was then measured with a surface shape measuring device (FM 200 available from Tropel), and a ROA value of the wafer was calculated from the measurement result near the edge portion of the wafer in accordance with the above definition. As a result, the ROA value of Example 1 was 0.38 μm, confirming that the surface near the edge portion of the wafer also had high flatness. In this case, a surface roughness at the central portion of the wafer was also measured with an AFM measuring machine (SII SPI 4000; a measuring range of 2 μm×2 μm), and the measurement result was analyzed by a surface analysis software (ProAna 3D). As a result, Ra was 0.14 nm, which was good surface roughness. Further, a TTV value of the wafer was 5.4 μm.

Example 2

A final one side polishing of an InP wafer having a diameter of 4 inches (101.6 mm), a thickness of 650 μm, an ROA of 0.33 μm, and an Ra of 0.61 nm was carried out by two-stage polishing steps as described below. The respective polishing conditions such as the rotating surface plate used for polishing, the rotation speed thereof, the material of the polishing pad, the composition of the polishing solution, and the supply flow rate of the polishing solution are the same as those in Example 1. The total polishing load in the polishing step is 650 g/cm$^2$·min, which was the same as that of Example 1.

first stage polishing: a processing pressure of 200 g/cm², a polishing time of 1 minute; and second stage polishing: a processing pressure of 300 g/cm², a polishing time of 1 minute 30 seconds (1.5 minutes).

After the end of the above polishing, washing and drying were carried out, and a thickness at the center portion of the wafer was measured. As a result, the thickness was 649 μm. An ROA value, a surface roughness Ra at the central portion of the wafer, and a TTV value were evaluated as in Example 1. As a result, the ROA value was 0.45 μm, the Ra was 0.16 nm, and the TTV value was 5.1 μm. As with Example 1, it was confirmed that an InP wafer having good ROA and Ra was obtained.

Comparative Example 1

A final one side polishing of an InP wafer having a diameter of 4 inches (101.6 mm), a thickness of 650 μm, an ROA of 0.30 μm, and an Ra of 0.60 nm was carried out by the conventional one-stage polishing step as described below. The respective polishing conditions such as the rotating surface plate used for polishing, the rotation speed thereof, the material of the polishing pad, the composition of the polishing solution, and the supply flow rate of the polishing solution are the same as those in Example 1. The total polishing load in the polishing step is 650 g/cm²·min, which was the same as that of Example 1.

first stage polishing: a processing pressure of 200 g/cm², a polishing time of 3 minute 15 seconds (3.25 minutes).

After the end of the above polishing, washing and drying were carried out, and a thickness at the central portion of the wafer was measured. As a result, the thickness was 648 μm. An ROA value, a surface roughness Ra at the central portion of the wafer, and a TTV value were then evaluated as in Example 1. As a result, the ROA value of Comparative Example 1 was 1.10 μm, the Ra was 0.18 nm, and the TTV value was 6.4 μm. In Comparative Example 1 according to the prior art, although the total polishing load was the same as that of Example 1, the ROA value was greatly deteriorated as compared with Example 1, indicating that and "surface sagging" occurred near the edge portion of the wafer and the flatness was poor.

Comparative Example 2

A final one side polishing of an InP wafer having a diameter of 4 inches (101.6 mm), a thickness of 650 μm, an ROA of 0.28 μm, and an Ra of 0.56 nm was carried out by two-stage polishing steps as described below. The respective polishing conditions such as the rotating surface plate used for polishing, the rotation speed thereof, the material of the polishing pad, the composition of the polishing solution, and the supply flow rate of the polishing solution are the same as those in Example 1. The total polishing load in the polishing step is 650 g/cm²·min, which was the same as that of Example 1.

first stage polishing: a processing pressure of 200 g/cm², a polishing time of 1 minute; and second stage polishing: a processing pressure of 600 g/cm², a polishing time of 45 seconds (0.75 minutes).

After the end of the above polishing, washing and drying were carried out, and a thickness at the central portion of the wafer was measured. As a result, the thickness was 650 μm. An ROA value, a surface roughness Ra at the central portion of the wafer, and a TTV value were then evaluated as in Example 1. As a result, the ROA value was 1.20 μm, the Ra was 0.13 nm, and the TTV value was 6.0 μm. It was confirmed that the ROA could not be improved unless the polishing conditions specified by the method according to the present invention were satisfied, even if the two-step polishing was performed with the same polishing load.

Example 3

A final one side polishing of an InP wafer having a diameter of 2 inches (50.8 mm), a thickness of 350 μm, an ROA of 0.25 μm, and an Ra of 0.63 nm was carried out by two-stage polishing steps as described below. The respective polishing conditions such as the rotating surface plate used for polishing, the rotation speed thereof, the material of the polishing pad, the composition of the polishing solution, and the supply flow rate of the polishing solution are the same as those in Example 1. The total polishing load in the polishing step is 650 g/cm²·min, which was the same as that of Example 1.

first stage polishing: a processing pressure of 200 g/cm², a polishing time of 1 minute; and second stage polishing: a processing pressure of 300 g/cm², a polishing time of 1 minute 30 seconds (1.5 minutes).

After the end of the above polishing, washing and drying were carried out, and a thickness at the central portion of the wafer was measured. As a result, the thickness was 349 μm. An ROA value, a surface roughness Ra at the central portion of the wafer, and a TTV value were then evaluated as in Example 1. As a result, the ROA value was 0.35 μm, the Ra was 0.15 nm, and the TTV value was 3.1 μm. As with Example 1, it was confirmed that an InP wafer having good ROA and Ra was obtained.

Example 4

A final one side polishing of an InP wafer having a diameter of 3 inches (76.2 mm), a thickness of 650 μm, an ROA of 0.27 μm, and an Ra of 0.58 nm was carried out by two-stage polishing steps as described below. The respective polishing conditions such as the rotating surface plate used for polishing, the rotation speed thereof, the material of the polishing pad, the composition of the polishing solution, and the supply flow rate of the polishing solution are the same as those in Example 1, The total polishing load in the polishing step is 650 g/cm²·min, which was the same as that of Example 1.

first stage polishing: a processing pressure of 200 g/cm², a polishing time of 1 minute; and second stage polishing: a processing pressure of 300 g/cm², a polishing time of 1 minute 30 seconds (1.5 minutes).

After the end of the above polishing, washing and drying were carried out, and a thickness at the central portion of the wafer was measured. As a result, the thickness was 649 μm. An ROA value, a surface roughness Ra at the central portion of the wafer, and a TTV value were then evaluated as in Example 1. As a result, the ROA value was 0.36 μm, the Ra was 0.16 nm, and the TTV value was 4.9 μm. As with Example 1, it was confirmed that an InP wafer having good ROA and Ra was obtained.

TABLE 1

| | | Polishing | | | | | Before First Stage Polishing | | After Second Stage Polishing | | |
|---|---|---|---|---|---|---|---|---|---|---|---|
| | | First Stage Polishing | | Second Stage Polishing | | Total | | | | | |
| | Diameter | Pressure (g/cm$^2$) | Time (min) | Pressure (g/cm$^2$) | Time (min) | Polishing Load (g/cm$^2$ · min) | ROA (μm) | Ra (μm) | ROA (μm) | Ra (nm) | TTV (μm) |
| Example 1 | 4 inches | 100 | 0.5 | 300 | 2.0 | 650 | 0.29 | 0.55 | 0.38 | 0.14 | 5.4 |
| Example 2 | | 200 | 1 | 300 | 1.5 | 650 | 0.33 | 0.61 | 0.45 | 0.16 | 5.1 |
| Comparative Example 1 | | 200 | 3.25 | — | — | 650 | 0.30 | 0.60 | 1.10 | 0.18 | 6.4 |
| Comparative Example 2 | | 200 | 1 | 600 | 0.75 | 650 | 0.28 | 0.56 | 1.20 | 0.13 | 6.0 |
| Example 3 | 2 inches | 200 | 1 | 300 | 1.5 | 650 | 0.25 | 0.63 | 0.35 | 0.15 | 3.1 |
| Example 4 | 3 inches | 200 | 1 | 300 | 1.5 | 650 | 0.27 | 0.58 | 0.36 | 0.16 | 4.9 |

INDUSTRIAL APPLICABILITY

The present invention relates to an InP wafer that maintains high flatness up to the vicinity of an edge portion of a surface of an InP single crystal wafer used as a substrate for producing various semiconductor devices, and to a method for effectively producing such an InP wafer, whereby it is possible to maximize a forming region of the device up to the vicinity of the edge portion of the wafer, and it is also possible to improve the uniformity of performance of the device formed in the wafer. Therefore, the present invention leads to an improvement of a producing yield of the device and a reduction of the production cost, and is thus useful in technical fields of semiconductor device production and the like.

What is claimed is:

1. An indium phosphide (InP) wafer, the wafer comprising an InP single crystal, wherein the wafer has a roll-off value (ROA) of from −1.0 μm to 1.0 μm, wherein the roll-off value (ROA) is a difference between a value extrapolated in a distance of 1 mm from the edge portion of the wafer in a reference profile function and an actual value of the surface profile, and the reference profile function is obtained from a straight line connecting measurement points at a position of 3 mm and a position of 6 mm from the wafer edge to the central portion side.

2. The InP wafer according to claim 1, wherein a central portion of the wafer has an arithmetic mean roughness (Ra) of 0.5 nm or less.

3. The InP wafer according to claim 1, wherein the wafer has a total thickness variation (TTV) of 10 μm or less.

4. The InP wafer according to claim 1, wherein the wafer has a thickness of 300 μm or more and 1000 μm or less.

5. The InP wafer according to claim 1, wherein a surface of the wafer has a maximum length of 45 mm or more.

6. The InP wafer according to claim 1, wherein a surface of the wafer has a maximum length of 50 mm or more.

7. The InP wafer according to claim 1, wherein a surface of the wafer has a maximum length of 75 mm or more.

8. The InP wafer according to claim 1, wherein a surface of the wafer has a maximum length of 100 mm or more.

9. A method for producing an indium phosphide (InP) wafer, the wafer comprising an InP single crystal, the method comprising:
performing a first stage polishing under a processing pressure of from 10 to 200 g/cm$^2$ for a processing time of from 0.1 to 5 minutes, while supplying a polishing solution containing bromine to at least one side of an InP single crystal substrate that will form the InP wafer; and
performing a second stage polishing under a processing pressure of from 200 to 500 g/cm$^2$ for a processing time of from 0.5 to 10 minutes, provided that the processing pressure is higher than that of the first stage polishing by 50 g/cm$^2$ or higher.

10. The method for producing the InP wafer according to claim 9, wherein the polishing is performed by using a rotating surface plate having a polishing pad made of soft foamed polyurethane attached to a surface of the rotating surface plate.

11. The method for producing the InP wafer according to claim 9, wherein the polishing is performed at a supply flow rate of the polishing solution of from 10 to 500 ml/min and at a rotation speed of the surface plate of from 10 to 100 rpm.

* * * * *